United States Patent
Adachi et al.

(10) Patent No.: US 10,522,704 B2
(45) Date of Patent: Dec. 31, 2019

(54) SOLAR CELL, METHOD FOR MANUFACTURING SAME

(71) Applicant: KANEKA CORPORATION, Osaka-shi, Osaka (JP)

(72) Inventors: Daisuke Adachi, Settsu (JP); Toru Terashita, Settsu (JP)

(73) Assignee: KANEKA CORPORATION, Osaka (JP)

( * ) Notice: Subject to any disclaimer, the term of this patent is extended or adjusted under 35 U.S.C. 154(b) by 118 days.

(21) Appl. No.: 15/550,047

(22) PCT Filed: Feb. 12, 2016

(86) PCT No.: PCT/JP2016/054180
§ 371 (c)(1),
(2) Date: Aug. 10, 2017

(87) PCT Pub. No.: WO2016/129686
PCT Pub. Date: Aug. 18, 2016

(65) Prior Publication Data
US 2018/0033904 A1 Feb. 1, 2018

(30) Foreign Application Priority Data

Feb. 13, 2015 (JP) ................................. 2015-026934

(51) Int. Cl.
*H01L 31/0747* (2012.01)
*H01L 31/0224* (2006.01)
(Continued)

(52) U.S. Cl.
CPC .... *H01L 31/0747* (2013.01); *H01L 31/02167* (2013.01); *H01L 31/02363* (2013.01);
(Continued)

(58) Field of Classification Search
CPC ....... H01L 31/02167; H01L 31/022433; H01L 31/022466; H01L 31/02363;
(Continued)

(56) References Cited

U.S. PATENT DOCUMENTS

2011/0095239 A1  4/2011  Ota et al.
2012/0097244 A1* 4/2012  Adachi ........... H01L 31/022483
                                                        136/256
(Continued)

FOREIGN PATENT DOCUMENTS

JP  2002-076398 A  3/2002
JP  2009-064603 A  3/2009
(Continued)

OTHER PUBLICATIONS

English translation of International Search Report for PCT/JP2016/054180 dated Apr. 26, 2016.

*Primary Examiner* — Duy T Nguyen
(74) *Attorney, Agent, or Firm* — HEA Law PLLC

(57) ABSTRACT

The solar cell includes a collecting electrode on a first principal surface of a photoelectric conversion section. The collecting electrode comprises a first electroconductive layer and a second electroconductive layer in this order from the photoelectric conversion section side. An insulating layer is provided on the first principal surface of the photoelectric conversion section so as to cover substantially the entire surface of the region where the first electroconductive layer is not provided and a part of the first electroconductive layer. The insulating layer on the first electroconductive layer has an opening, and the second electroconductive layer is a plating layer that is in conduction with the first electroconductive layer through the opening section of the insulating layer. The first electroconductive layer contains a metal particle component and an insulating material. The metal particle component of the first electroconductive layer includes primary particles and secondary particles. It is preferable that in a cross-section of the first electroconductive layer, the area ratio of the secondary particles to the total of the primary particles and the secondary particles and the coefficient of variation of the particle size are respectively within specific ranges.

19 Claims, 4 Drawing Sheets

(51) Int. Cl.
*H01L 31/20* (2006.01)
*H01L 31/0376* (2006.01)
*H01L 31/18* (2006.01)
*H01L 31/0745* (2012.01)
*H01L 31/0216* (2014.01)
*H01L 31/0236* (2006.01)

(52) U.S. Cl.
CPC ........... *H01L 31/022433* (2013.01); *H01L 31/022466* (2013.01); *H01L 31/03762* (2013.01); *H01L 31/0745* (2013.01); *H01L 31/1804* (2013.01); *H01L 31/208* (2013.01); *Y02E 10/547* (2013.01); *Y02P 70/521* (2015.11)

(58) Field of Classification Search
CPC ........... H01L 31/03762; H01L 31/0745; H01L 31/0747; H01L 31/1804; H01L 31/208; Y02E 10/547; Y02P 70/521
USPC .......................................................... 438/48
See application file for complete search history.

(56) References Cited

U.S. PATENT DOCUMENTS

| | | |
|---|---|---|
| 2012/0240998 A1 | 9/2012 | Ballif |
| 2013/0167923 A1* | 7/2013 | Nakamura ............... H01B 1/22 136/256 |
| 2013/0284263 A1* | 10/2013 | Mitta ............... H01L 31/022425 136/256 |
| 2013/0312827 A1 | 11/2013 | Adachi et al. |
| 2016/0126399 A1* | 5/2016 | Hino ............... H01L 31/022425 136/256 |

FOREIGN PATENT DOCUMENTS

| | | |
|---|---|---|
| JP | 2010-087131 A | 4/2010 |
| JP | 2010-196105 A | 9/2010 |
| JP | 2013-507781 A | 3/2013 |
| JP | 2013-196954 A | 9/2013 |
| JP | 2013-258139 A | 12/2013 |
| JP | 2014-229876 A | 12/2014 |
| WO | 2012/176831 A1 | 12/2012 |
| WO | 2013/077038 A1 | 5/2013 |

* cited by examiner $$\frac{L_N}{\text{outer circumferential length}} = \frac{a2}{a1+a2} > 15\%$$

$$\frac{b1+b2}{b1+b2+b3+b4} > 15\%$$

$$\frac{c2}{c1+c2} < 15\%$$

US 10,522,704 B2

SOLAR CELL, METHOD FOR MANUFACTURING SAME

CROSS REFERENCE TO RELATED APPLICATIONS

This application is a National Stage of International Application No. PCT/JP2016/054180 filed on Feb. 12, 2016, which claims priority from Japanese Patent Application 2015-026934, filed on Feb. 13, 2015. The contents of the above documents are incorporated herein by reference in their entirety.

TECHNICAL FIELD

The invention relates to a solar cell and method for manufacturing the same. The invention also relates to a solar cell module.

BACKGROUND ART

In the solar cell, carriers (electrons and holes) generated by light irradiation on a photoelectric conversion section having a semiconductor junction are extracted to an external circuit to generate electricity. A collecting electrode is provided on the photoelectric conversion section of the solar cell for efficiently extracting carriers generated at the photoelectric conversion section to the external circuit. For example, in a crystalline silicon-based solar cell using a single-crystalline silicon substrate or a polycrystalline silicon substrate, a collecting electrode made of a fine metal is provided on a light-incident-surface. Also, in a heterojunction solar cell having amorphous silicon layers and transparent electrode layers on a crystalline silicon substrate, a collecting electrode is provided on the transparent electrode layer.

The collecting electrode of the solar cell is generally formed by pattern-printing a silver paste (electroconductive paste) by a screen printing method. Regarding a silver paste applicable for formation of a collecting electrode for a solar cell, The following patent documents describe the use of an electroconductive paste containing a spherical electroconductive filler (granular metal particles) and a flaky electroconductive filler (flaky metal particles), both for a reduction of the line width (fining) of a collecting electrode, reduction of resistance, improvement of adhesive strength, and so on: JP A 2002-76398, JP A 2010-87131, and JP A 2013-196954.

One problem with screen printing a silver paste is that the material cost of silver is high. Another problem is that the resistivity of a collecting electrode increases because the silver paste contains an insulating resin material used as a binder. To reduce the resistance of a collecting electrode formed using a silver paste, it is necessary to thickly print the silver paste. Increasing the printing thickness causes a line width of the electrode to increase. Therefore, it is difficult to decrease the collecting electrode width, so that a shading loss caused by the collecting electrode easily increases.

To solve these problems, a method is known for forming a collecting electrode by a plating method that is excellent in terms of a material cost and a process cost. JP A 2013-507781 discloses a method in which as an underlying layer for plating, an electroconductive seed having a large surface roughness is provided on a transparent electrode layer, and an insulating layer is formed on the electroconductive seed. Specifically, an electroconductive seed is formed on a transparent electrode layer using an electroconductive paste containing silver flakes, nanoparticles or the like, and then an insulating layer is formed. The transparent electrode layer is covered with the insulating layer except for an electroconductive seed-formed section. A discontinuous opening section is formed in the insulating layer on the electroconductive seed due to the surface roughness of the electroconductive seed. A metal layer is formed on the electroconductive seed through the opening section of the insulating layer by an electroplating method.

WO 2013/077038 discloses a solar cell including a transparent electrode layer, a first electroconductive layer (plating underlying layer) and a second electroconductive layer (plating layer) on the transparent electrode layer, and an insulating layer between the first electroconductive layer and the second electroconductive layer. WO 2013/077038 describes that an insulating layer is formed on a first electroconductive layer containing a low-melting-point material. An annealing treatment is then performed by heating to form an opening section in the insulating layer on the first electroconductive layer due to thermal-fluidization of the low-melting-point material. A second electrconductive layer is formed on the first electroconductive layer through the opening section by a plating method. WO 2013/077038 also describes that metal particles having a particle size of 1 μm or less can be applied as a low-melting-point material because thermal-fluidization associated with fusion occurs at a temperature lower than a melting point.

SUMMARY OF THE INVENTION

Problems to be Solved by the Invention

In a method utilizing thermal fusion of fine metal particles contained in an electroconductive paste as disclosed in WO 2013/077038, formation of an opening in an insulating layer may be insufficient, or an excessively large opening may be formed, and thus it may be difficult to form an electrode by a plating method. Contact resistance between a photoelectric conversion section and a collecting electrode may also increase. Particularly, when the annealing temperature is low, formation of an opening is apt to be insufficient, so that the fill factor may be reduced in a solar cell having a low heat-resistant temperature like a heterojunction solar cell. An object of the present invention is to solve the above-mentioned problems and to provide a high-efficiency solar cell including a collecting electrode formed using plating.

Means for Solving the Problems

The present inventors have extensively conducted studies in view of the above-mentioned problems, and resultantly found that by controlling the fine structure of a metal particle component in a first electroconductive layer (plating underlying layer), contact resistance can be reduced, and thus a solar cell having a high conversion efficiency is obtained.

A solar cell of the present invention includes a collecting electrode on a first principal surface of a photoelectric conversion section. The collecting electrode includes a first electroconductive layer and a second electroconductive layer in this order from the photoelectric conversion section side. An insulating layer is provided on the first principal surface of the photoelectric conversion section. The insulating layer is formed to cover a part of the first electroconductive layer and substantially the entirety of a first electroconductive layer-non-formed region which is not provided with the first electroconductive layer. The insulating layer on the first electroconductive layer has an opening section. The second electroconductive layer is a plating layer that is in conduction with the first electroconductive layer through the opening section of the insulating layer.

The first electroconductive layer contains a metal particle component and an insulating material. The metal particle component in the first electroconductive layer includes primary particles and secondary particles. The primary particle is a particle in which a region where the particle is fused with other metal particles occupies less than 15% of the outer circumferential length in observation of a cross-section of the first electroconductive layer. The secondary particle includes a metal particle in which a region where a primary particle is fused with other metal particles occupies 15% or more of the outer circumferential length, and one or more metal particles fused with the above-mentioned metal particle. The area ratio of secondary particles to the total of primary particles and secondary particles on a cross-section of the first electroconductive layer is 1% or more and 30% or less, and the coefficient of variation in particle size is 0.3 or more. The average particle size of metal particles in the metal particle component is preferably 1 μm or less.

A method for manufacturing a solar cell according to the present invention includes: a first electroconductive layer material printing step of printing an electroconductive paste in a pattern shape on a first principal surface of a photoelectric conversion section, the electroconductive paste containing metal particles and an insulating material; an insulating layer forming step of forming an insulating layer on the first principal surface of the photoelectric conversion section; and a plating step of forming a second electroconductive layer on the first electroconductive layer through an opening section of the insulating layer by a plating method, in this order. Further, an annealing step of heating the electroconductive paste to form an opening section in the insulating layer is carried out after the printing step and before the plating step. It is preferred that on a cross-section of the first electroconductive layer after the annealing step, the metal particle component includes primary particles and secondary particles, and the area ratio of secondary particles and the coefficient of variation in particle size each fall within the range as described above.

Preferably, a metallic material in the electroconductive paste contains metal particles having a particle size of less than 300 nm. The heating temperature in the annealing step is preferably 250° C. or lower.

Effects of the Invention

Fusion of metal particles occurs in during a heat annealing treatment of a first electroconductive layer material, so that an opening section is formed in an insulating layer. A second electroconductive layer is thereafter formed through the opening section by a plating method. In the present invention, the progress of fusing the metal particles is appropriately controlled so that the opening section is formed in the insulating layer on the first electroconductive layer, and formation of the opening section in the insulating layer in the vicinity of the end portion of the first electroconductive layer is suppressed. Thus, a plating solution is inhibited from contacting a photoelectric conversion section, and a shading loss caused by deposition of an undesired plating metal can be reduced so that a solar cell having high conversion efficiency is obtained.

MODE FOR CARRYING OUT THE INVENTION

Figure 1:
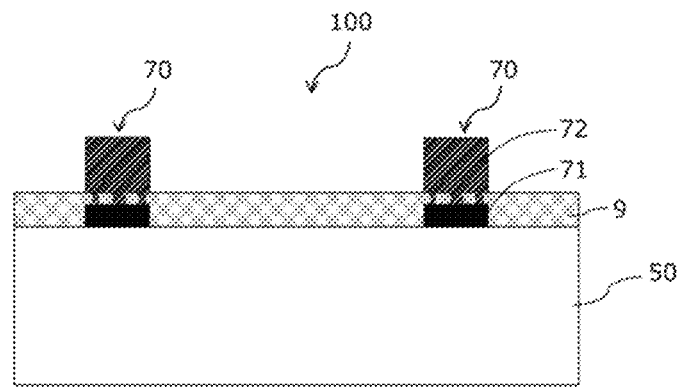
FIG. 1 is a schematic sectional view showing a solar cell according to one embodiment of the present invention.

As schematically shown in FIG. 1, a solar cell 100 of the present invention includes a collecting electrode 70 on one principal surface of a photoelectric conversion section 50. The collecting electrode 70 includes a first electroconductive layer 71 and a second electroconductive layer 72 in this order from the photoelectric conversion section 50 side. On the first principal surface of the photoelectric conversion section, an insulating layer 9 is provided to substantially cover the entirety of a first electroconductive layer-non-formed region which is not provided with the first electroconductive layer, and a part of the first electroconductive layer. Thus, the insulating layer on the first electroconductive layer has an opening section. The second electroconductive layer is a plating layer, which is in electrical conduction with the first electroconductive layer through the opening section. The first electroconductive layer contains a metal particle component and an insulating material. The metal particle component includes primary particles, and secondary particles with metal particles fused together.

The structure of the solar cell will be described more in detail below taking as an example a heterojunction solar cell. The heterojunction solar cell is a crystalline silicon-based solar cell in which a silicon-based thin-film having a band gap different from that of a single-crystalline silicon is formed on a surface of a single-crystalline silicon substrate of a first conductivity-type to produce a diffusion potential. The silicon-based thin-film is preferably amorphous. A heterojunction solar cell having a thin intrinsic amorphous silicon layer interposed between a conductive amorphous silicon-based thin-film for forming a diffusion potential and a crystalline silicon substrate is known as one configuration of a crystalline silicon solar cell with the highest conversion efficiency.

Figure 2:
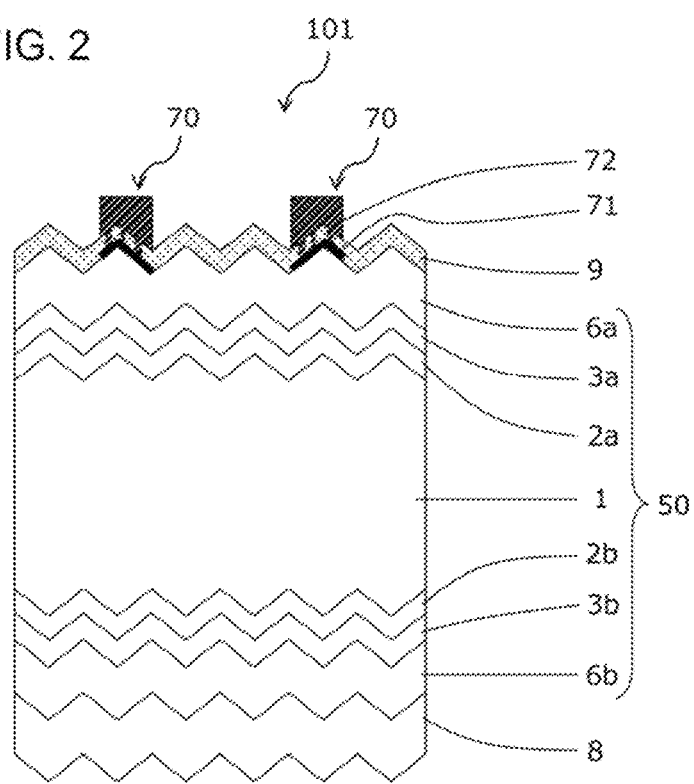
FIG. 2 is a schematic sectional view showing a heterojunction solar cell according to one embodiment.

FIG. 2 is a schematic sectional view of a heterojunction solar cell according to one embodiment of the present invention. The heterojunction solar cell 101 shown in FIG. 2 includes, as a photoelectric conversion section 50, a conductive silicon-based thin-film 3a and a light-incident-side transparent electrode layer 6a in this order on one surface (surface on the light-incident-side) of single-crystalline silicon substrate 1 of a first conductivity-type. It is preferred that a conductive silicon-based thin-film 3b and a back transparent electrode layer 6b are provided in this order on the other surface (surface opposite to the light reflecting side) of the single-crystalline silicon substrate 1 of the first conductivity-type. It is preferred that intrinsic silicon-based thin-films 2a and 2b are provided between the substrate 1 and the conductive silicon-based thin-films 3a and 3b, respectively. On the light-incident-side transparent electrode layer 6a of the surface of the photoelectric conversion section 50, a collecting electrode 70 having a first electroconductive layer 71 and a second electroconductive layer 72 is provided. It is preferred that a back-side metal electrode 8 is provided on the back-side transparent electrode layer 6b.

An insulating layer 9 having an opening section is provided between the first electroconductive layer 71 and the second electroconductive layer 72. On the first principal surface of the light-incident-side transparent electrode layer 6a, the insulating layer 9 is formed also on the first electroconductive layer-non-formed region.

[Photoelectric Conversion Section]

Generally, the single-crystalline silicon substrate contains impurities that supply charge carriers to silicon for imparting conductivity. A single-crystalline silicon substrate is classified into an n-type which contains atoms for introducing electrons into silicon atoms (e.g., phosphorus) and a p-type which contains atoms for introducing holes into silicon atoms (e.g., boron). That is, the "first conductivity-type" means one of the n-type and the p-type. In order to enhance light confinement, the single-crystalline silicon substrate 1 preferably has a textured outside surface structure (e.g., irregularity structure, surface roughness, waviness).

Silicon-based thin-films are formed on the single-crystalline silicon substrate 1 having textured surface. Examples of the silicon-based thin-film include an amorphous silicon thin-film and microcrystalline silicon thin-film (a thin-film including amorphous silicon and crystalline silicon). Among them, an amorphous silicon-based thin-film is preferably used. The conductive silicon-based thin-films 3a and 3b are silicon-based thin-films of first conductivity-type or opposite conductivity-type. For example, when the crystalline silicon substrate 1 of the first conductivity-type is n-type, the silicon-based thin-film of the first conductivity-type and the silicon-based thin-film of the opposite conductivity-type are n-types and p-types, respectively. The deposition method for forming the silicon-based thin-films is preferably a plasma-enhanced CVD method. As a dopant gas for forming p-type or n-type silicon-based thin-film, $B_2H_6$, $PH_3$, or the like is preferably used. When a gas containing a different element, such as $CH_4$, $CO_2$, $NH_3$ or $GeH_4$, is added in deposition of the conductive silicon-based thin-film, the silicon-based thin-film is alloyed so that the energy gaps of the silicon-based thin-film can be changed.

The intrinsic silicon-based thin-films 2a and 2b are preferably i-type hydrogenated amorphous silicon composed of silicon and hydrogen. When i-type hydrogenated amorphous silicon is formed on a single-crystalline silicon substrate by a CVD method, surface passivation can be effectively performed while suppressing diffusion of impurities to the single-crystalline silicon substrate.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable because the optical loss can be reduced.

On the conductive silicon-based thin-films 3a and 3b, the photoelectric conversion section 50 of the heterojunction solar cell 101 includes transparent electrode layers 6a and 6b containing conductive oxide as a main component. As the conductive oxide, for example, zinc oxide, indium oxide and tin oxide may be used alone or in mixture thereof. From the viewpoints of electroconductivity, optical characteristics and long-term reliability, indium-based oxides including indium oxide are preferable. Among them, those having indium tin oxide (ITO) as a main component are more suitably used. The transparent electrode layer may be a single layer or a layered structure composed of multiple layers.

In this specification, the wording "as a main component" means that the content is more than 50% by weight, preferably 70% by weight or more, more preferably 90% by weight or more.

The thickness of the light-incident-side transparent electrode layer 6a is preferably set to 10 nm or more and 140 nm or less, from the viewpoints of transparency, electroconductivity and reduction of light reflection. The role of the transparent electrode layer 6a is to transport carriers to the collecting electrode 70, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range (10 nm-140 nm), an increase in carrier concentration within the transparent electrode layer can be prevented, and therefore a reduction in photoelectric conversion efficiency associated with a reduction in transmittance in an infrared range is suppressed. The method for forming a transparent electrode layer is not particularly limited, but a physical vapor deposition method such as a sputtering method, a chemical vapor deposition (MOCVD) method utilizing a reaction of an organic metal compound with oxygen or water, or the like is preferable.

A back-side metal electrode 8 is preferably formed on the back-side transparent electrode layer 6b. For the back-side metal electrode 8, it is desirable to use a material having a high reflectivity in a near-infrared to infrared range, and having high electroconductivity and chemical stability. Examples of the material satisfying these characteristics include silver and aluminum. The method for forming a back-side metal electrode layer is not particularly limited, and a physical vapor deposition method such as a sputtering method or a vacuum vapor deposition method, or the like is applicable. Patterned collecting electrode may be formed on the back-side transparent electrode layer 6b. Printing method such as screen printing, or the like is applicable for formation of patterned metal electrode. Like the collecting electrode on the light-incident-side, the patterned metal electrode may be formed by a plating method.

[Configuration of Collecting Electrode]

The collecting electrode 70 in a pattern shape such as a grid shape or a comb shape is formed on the transparent electrode layer 6a. The collecting electrode 70 includes the first electroconductive layer 71 and the second electroconductive layer 72. The insulating layer 9 is formed to cover substantially the entire region of the transparent electrode layer 6a, which is not provided with a collecting electrode (collecting electrode-non-formed region), and the first electroconductive layer 71. The insulating layer arranged between the first electroconductive layer 71 and the second electroconductive layer 72 is provided with an opening section. In the collecting electrode 70, the second electroconductive layer 72 is in contact with the first electroconductive layer 71 through the opening provided in the insulating layer.

(First Electroconductive Layer)

The first electroconductive layer 71 contains a metal particle component and an insulating material. The first electroconductive layer 71 is a layer that functions as an electroconductive underlying layer when the second electroconductive layer 72 is formed by a plating method. Therefore, it is sufficient that the first electroconductive layer has such a level of electroconductivity that it can function as an underlying layer for electroplating. In this specification, those having a volume resistivity of $10^{-2}$ Ω·cm or less are defined as being electroconductive. Those having a volume resistivity of $10^2$ Ω·cm or more are defined as being insulating.

The thickness of the first electroconductive layer 71 is preferably 20 μm or less, more preferably 10 μm or less, (e.g., cost perspective). On the other hand, the thickness is preferably 0.5 μm or more, more preferably 1 μm or more, so that the line resistance of the first electroconductive layer 71 falls within a desired range.

The material of the metal particle component in the first electroconductive layer 71 is not particularly limited as long as it is a metallic material having electroconductivity, and for example, silver, copper, nickel, aluminum, mixtures thereof and the like can be used. A material in which the surfaces of particles are covered with a different kind of metallic material, e.g., a copper particle having silver coating on a surface thereof, can also be used. In particular, silver is preferably used as a material of the metal particle component, since silver has a low resistivity, can be sprayed in the air, and does not result in a thick oxide covering on the surface.

As a material for forming the first electroconductive layer, an electroconductive paste containing an insulating material can be used in addition to the metallic material. As the insulating material in the electroconductive paste, a resin material is generally used. The first electroconductive layer can be formed by an inkjet method, a screen printing method or the like. For forming a first electroconductive layer in a pattern shape, a screen printing method is suitable from the viewpoint of productivity. In the screen printing method, a pattern of a collecting electrode is printed using an electroconductive paste containing a particulate metallic material, and a screen mask having an opening section pattern corresponding to the pattern shape of the collecting electrode. The electroconductive paste may contain a solvent such as butyl carbitol acetate, ethyl carbitol acetate or α-terpineol, and various kinds of additives.

It is desirable to cure the first electroconductive layer material by heating for sufficiently improving the electroconductivity of the first electroconductive layer formed by the screen printing method. In this specification, the "first electroconductive layer material" means a material for forming the first electroconductive layer before formation of the opening section on the insulating layer (before annealing treatment), and includes an electroconductive paste before printing, and an electroconductive paste-printed layer. The first electroconductive layer material also includes an electroconductive paste-printed layer in a temporarily dried state, which is solidified by removing a solvent, etc. with heating under such a condition that fusion of the metal particle component hardly progresses (at a temperature lower than the fusion temperature of the metallic material).

When a material containing a solvent is used as the electroconductive paste, a drying step for removing the solvent is required. Thus, it is preferred that a material curable at a solvent drying temperature is used as an insulating material contained in the paste, and an epoxy-based resin, a phenol-based resin, an acrylic resin or the like is applicable.

The metal particle component in the first electroconductive layer includes primary particles and secondary particles. The primary particles are small constituent elements of the metal particle component, which individually exist as single particles. The secondary particles are generated by aggregation of primary particles. Aggregates of metal particles can be classified broadly into weak aggregates in which a plurality of primary particles are bonded together with a weak force such as a Van der Waals force, and strong aggregates in which a plurality of primary particles are partially fused (sintered) and bonded together.

Figure 4A:
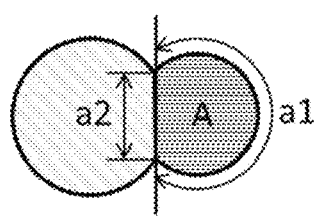
FIG. 4 is a conceptual view showing one example of the shape of metal particles after annealing treatment.
Figure 4B:
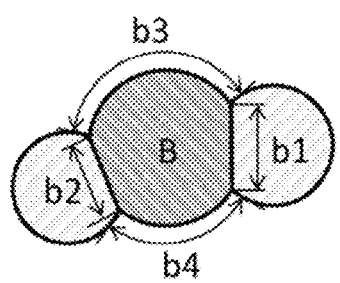
Figure 4C:
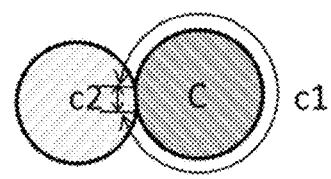

The secondary particle in this specification means a strong aggregate. Specifically, when as shown in FIG. 4A, a region $L_N$=a2 where one primary particle A is fused with one other primary particle, the L region occupies 15% or more of the outer circumferential length (a1+a2) of the particle A in cross-section observation. The particle A and the particle fused with the particle A are considered to form one secondary particle. When as shown in FIG. 4B, one particle B is fused with a plurality of other particles, and a region $L_N$=b1+b2 where the particle B is fused with the other particles, the $L_N$ region occupies 15% or more of the outer circumferential length (b1+b2+b3+b4) of the particle B. The particle B and the particles fused with the particle B are considered to form one secondary particle. When as shown in FIG. 4C, a part of the outer circumference of a particle C is in contact with another particle, but a contact region $L_N$=c2 thereof occupies less than 15% of the outer circumferential length (c1+c2), the particle C and the particle that is in contact with the particle C are considered primary particles. These primary particles do not form a secondary particle.

The structure of the first electroconductive layer can be evaluated by observing a cross-section in a direction (line-width direction) perpendicular to the extending direction of the first electrconductive layer. The cross-section of the first electroconductive layer can be formed by embedding the first electroconductive layer in a resin, etc., and then performing a polishing treatment. The cross-section may be formed by a focusing ion beam method or the like. When the cross-section is appropriately formed, necessary information such as the shape of metal particles can be relatively easily acquired using a scanning electron microscope.

Figure 9:
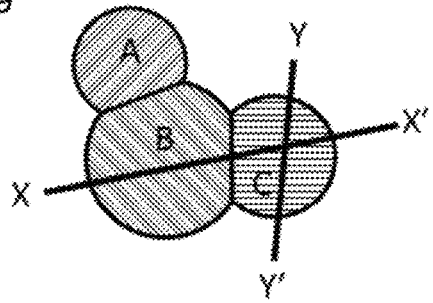
FIG. 9 is a conceptual view showing the shape of the metal particle component in which fusion occurs.

Even particles which form a secondary particle may be determined as primary particles in a cross-section observation. For example, when observed at a cross-section X-X', an aggregate of three particles as schematically shown in FIG. 9 is determined as a secondary particle because mutually fused particles B and C are observed, but when observed at a cross-section Y-Y', the aggregate is determined as a primary particle because only a particle C is observed. In this case, whether the particle is a primary particle or a secondary particle is determined based on a cross-section observation image obtained.

When it is difficult to determine whether the particle is a primary particle or a secondary particle, it can be determined from the crystal orientation of each particle in a channeling image acquired using a scanning electron microscope or a scanning ion microscope. Generally, primary particles are randomly oriented, and therefore the probability that a secondary particle with uniform crystal orientations of primary particles is formed is extremely low. Accordingly, a particle in which a neck portion exists, and regions on both sides of the neck portion have different crystal orientations can be determined as a secondary particle. The channeling image may be observed when electrons are used as an irradiation beam, but since a higher contrast is obtained when ions, particularly Ga ions are used, so that evaluation may be more easily performed when the image is observed using a scanning ion microscope.

The area ratio of secondary particles to the total of primary particles and secondary particles in the metal particle component is preferably 1 to 30%, more preferably 2 to 25%, further preferably 4 to 20%. The area ratio is calculated based on the result of cross-section observation as described above. Secondary particles in the metal particle component are generated mainly by fusion of the metallic material during heating of the first electroconductive layer material (electroconductive paste). When the ratio of secondary particles is in the above-mentioned range, a solar cell having low contact resistance of a collecting electrode and excellent reliability is obtained.

The average particle size of the metal particle component contained in the first electroconductive layer is preferably 1 µm or less, more preferably 0.5 µm or less, further preferably 0.4 µm or less. In the metal particle component contained in the first electroconductive layer, the coefficient of variation CV in particle size is preferably 0.3 or more, more preferably 0.5 or more, further preferably 0.8 or more. When metal particles form a secondary particle, the particle size D is calculated with the secondary particle and is considered one particle. The coefficient of variation CV is defined by the following formula.

$$CV = [\text{standard deviation of particle size}] / [\text{average particle size}] \quad (1)$$

When the ratio of secondary particles in the first electroconductive layer and the coefficient of variation in particle size each fall within an appropriate range, a solar cell having high efficiency and high reliability is obtained. Preferably, the first electroconductive layer contains primary particles having a particle size of 1 µm or more. When particles having a relatively large particle size are contained, an excessive increase in ratio of secondary particles is suppressed, so that the area ratio of secondary particles is easily adjusted within the above-mentioned range. The number of primary particles having a particle size of 1 µm or more is preferably 0.5 to 15%, more preferably 1 to 10% of the total number of particles.

The particle size D of the metal particle component can be determined from the diameter of the particle when the particle is spherical (the cross-section of the particle is circular). When the particle is nonspherical, the cross-section area S of the particle is calculated, and the diameter (equivalent circle diameter) of a circle having the cross-section area S is defined as the particle size D, as shown by the following formula.

$$D = 2 \times (S/\pi)^{0.5}$$

Figure 10A:
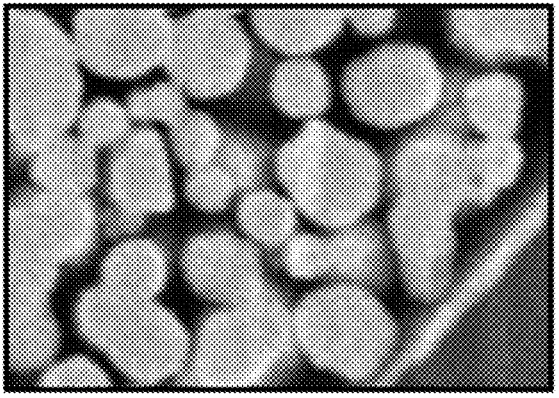
FIG. 10 shows a cross-sectional structure of the first electroconductive layer.
Figure 10B:
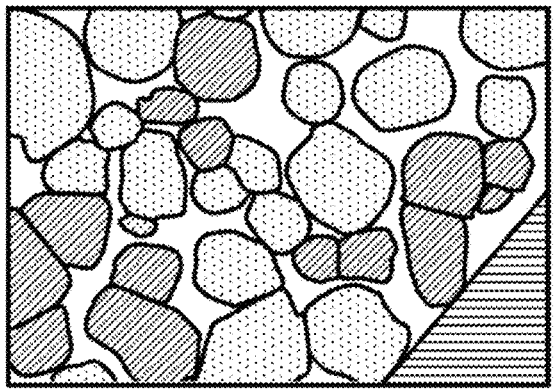

FIGS. 10A and 10B show a cross-section observation image of a solar cell in which a first electroconductive layer is provided on a photoelectric conversion section that includes a transparent electrode layer on a textured structure. Methods for calculating the area ratio and particle size of secondary particles in the metal particle component will be described with reference to FIGS. 10A and 10B. FIG. 10A shows a scanning electron microscope image of a cross-section in the vicinity of the first electroconductive layer. FIG. 10B shows the result of dividing particles in the metal particle component into primary particles and secondary particles in a visually distinguishable manner. A particle in which a region where the particle is fused with other particles occupies 15% or more of the outer circumferential length was classified as a secondary particle.

When all particles in the cross-section observation image shown in FIG. 10A are separated as primary particles, a total of 35 particles are identified. Among them, 21 particles are primary particles (a region where the particle is fused with other particles occupies less than 15% of the outer circumferential length), and 14 particles form 5 secondary particles (a region where the particle is fused with other particles occupies 15% or more of the outer circumferential length). The area ratio of the secondary particles to the total of the primary particles and the secondary particles is 38%. The coefficient of variation CV, which is determined from the ratio of the average particle size and the dispersion a of the particle size for the 26 particles shown in FIG. 10B, is 0.34.

The first electroconductive layer may include a plurality of layers. When the first electroconductive layer includes a plurality of layers, at least the outermost layer, in a thickness direction (a layer that is in contact with an insulating layer or plating layer formed on the first electroconductive layer), should serve as the first electroconductive layer in the present invention. For example, the first electroconductive layer may have a stacking configuration including a lower layer having low contact resistance with a transparent electrode layer on a surface of a photoelectric conversion section, and an upper layer containing a material having a low volume resistivity. With this configuration, it can be expected that contact resistance with the transparent electrode layer decreases, and the fill factor of the solar cell is accordingly improved.

When the first electroconductive layer includes a plurality of layers, the metal particle components in the layers may have different secondary particle ratios and coefficients of variation. When a metallic material component having a small primary particle size (particle size of the metallic material before annealing treatment) is used for the lower layer that is in contact with the transparent electrode layer, the number of contact points between the first electroconductive layer and the transparent electrode layer on a surface of the photoelectric conversion section tends to increase, leading to a reduction in contact resistance. When a metallic material component, having a large primary particle size, is contained in a relatively large amount, volume resistance tends to be reduced. Thus, owing to the stacking configuration including a lower layer having a relatively high content of a metallic material and also having a small primary particle size, and an upper layer having a relatively low content of a material and also having a small primary particle size, both contact resistance between the first electroconductive layer and the transparent electrode layer and line resistance of the first electroconductive layer can be reduced. For example, the content of metal particles having a primary particle size of less than 300 nm may be more in the lower layer than in the upper layer. When the metal particle components in the layers have different secondary particle ratios and coefficients of variation, the secondary particle ratio and the coefficient of variation in any one of the layers are preferably in the above-mentioned ranges, respectively. Particularly, the secondary particle ratio and the coefficient of variation in the upper layer that is in contact with the insulating layer 9 are preferably in the above-mentioned ranges, respectively.

[Insulating Layer]

The insulating layer 9 is formed on the first principal surface of the photoelectric conversion section. When the first electroconductive layer 71 is formed in a specific pattern (e.g. a comb-like pattern), the surface of the photoelectric conversion section 50 has a first electroconductive layer-non-formed region where the first electroconductive layer is formed, and a first electroconductive layer-non-formed region where no first electroconductive layer is formed. The insulating layer 9 is formed to cover the first electroconductive layer and first electroconductive layer-non-formed region.

The insulating layer 9 is formed on substantially the entirety of the first electroconductive layer non-formed region, and is preferably formed on the entirety of the first electroconductive layer-non-formed region. When the insulating layer covers the first electroconductive layer-non-formed region, the photoelectric conversion section can be chemically and electrically protected from a plating solution when the second electroconductive layer is formed by a plating method. "Substantially the entirety of the first electroconductive layer-non-formed region" means that the insulating layer occupies 95% or more of the first electroconductive layer-non-formed region on the first principal surface of the photoelectric conversion section.

As the material of the insulating layer 9, a material that is electrically insulating is used. It is desirable that the insulating layer 9 be a material having chemical stability to a plating solution. By using a material having high chemical stability to a plating solution, the insulating layer is hardly dissolved in a plating step during formation of the second electroconductive layer, so that damage to the surface of the photoelectric conversion section is hindered. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light-incident-side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, and the solar cell can be provided for a practical use without removing the insulating layer after forming the second electroconductive layer. Consequently, the process for manufacturing the solar cell can be simplified, so that productivity can be further improved.

The material of the insulating layer may be an inorganic insulating material or an organic insulating material. As the inorganic insulating material, a material such as silicon oxide, silicon nitride, titanium oxide, aluminum oxide, magnesium oxide or zinc oxide can be used. As the organic insulating material, a material such as polyester, an ethylene-vinyl acetate copolymer, acrylic, epoxy or polyurethane can be used. The material of the insulating layer is preferably an inorganic material having a low elongation at break, so that a formation of an opening section in the insulating layer, which occurs as the surface shape of the first electroconductive layer changes by stress or the like at the interface, in the annealing treatment is facilitated Among these inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate or the like is suitably used from the viewpoints of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride or the like is preferable from the viewpoints of electrical characteristics, adhesiveness with the transparent electrode layer, and so on, and silicon oxide, silicon nitride or the like is especially suitably used to adjust the refractive index appropriately. These inorganic materials are not limited to those having a stoichiometric composition, but may be those having oxygen-deficiencies.

The thickness of the insulating layer 9 may be set appropriately, according to the material of the insulating layer and method of formation thereof. The thickness of the insulating layer 9 is preferably so thin that an opening section can be formed in the insulating layer by stress or the like at the interface, which occurs as the surface shape of the first electroconductive layer is changed. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the solar cell is increased, so that conversion efficiency can be improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

(Second Electrconductive Layer)

The second electroconductive layer 72 is formed on the insulating layer 9 of the first electroconductive layer-formed region by a plating method. The second electroconductive layer may be formed by an electroless plating method or an electroplating method. The electroplating method is suitably used to increase productivity. In the electroplating method, the rate of deposition of a metal can be increased, so that the second electroconductive layer can be formed in less time.

The metal deposited as the second electroconductive layer is not particularly limited as long as it is a material that can be formed by a plating method, and for example, copper, nickel, tin, aluminum, chromium, silver, gold, zinc, lead, palladium or the like, or a mixture thereof can be used. Among them, copper or an alloy including copper as a main component is preferable for the metal that forms the second electroconductive layer due to a high precipitation rate in electroplating, high electroconductivity and low material cost.

The second electroconductive layer is primarily composed of copper or copper alloy, and can be formed by, for example, an acidic copper plating. A plating solution used for acidic copper plating contains copper ions, and a solution of known composition, which includes copper sulfate, sulfuric acid and water as main components, can be used.

Copper can be precipitated by causing a current of 0.1 to 20 A/dm$^2$ to pass the plating solution. The suitable plating time is appropriately set according to the area of the collecting electrode, the current density, cathode current efficiency, desired thickness and so on.

The second electroconductive layer may be composed of a plurality of layers. For example, by forming a first plating layer, made of a material having a high electroconductivity, such as Cu, on the first electroconductive layer through an opening section of the insulating layer, and then forming on the surface of the first plating layer a second plating layer excellent in chemical stability, a collecting electrode having low resistance and being excellent in chemical stability can be formed. As the second plating layer material, Sn or Ag can be preferably applied. By forming a second plating layer of a material having a high reflectivity, such as Ag, light-incident to a surface of the collecting electrode can be effectively utilized.

[Method for Forming Collecting Electrode]

Hereinafter, details of the material and structure of the first electroconductive layer, and the method for forming the collecting electrode will be described. In this embodiment, an annealing step is carried out after formation of the insulating layer 9 on the first electroconductive layer material and before formation of the second electroconductive layer 72. The annealing step and formation of the insulating layer may be carried out simultaneously. In other words, the insulating layer may be formed while heating is performed.

When the first electroconductive layer material is heated to a temperature higher than the fusion temperature of the metallic material during heating (annealing treatment) in the annealing step, thermal-fluidization associated with fusion of the metallic material contained in the first electroconductive layer material occurs, leading to a change in surface shape of the first electroconductive layer material. With this change, a crack-like opening section is formed in the insulating layer on the first electroconductive layer material. In the subsequent plating step, a part of a surface of the first electroconductive layer 71 is exposed to a plating solution, and thereby brought into direct contact with the first electroconductive layer so that a metal can be deposited with the resulting direct contact point as an origination point. In other words, an origination point for forming the second electroconductive layer by a plating method is formed through the annealing treatment. Thus, in the annealing treatment, fusion of the metallic material should progress to the extent that an opening section is formed in the insulating layer.

The annealing treatment is preferably performed at the annealing temperature Ta that is lower than the heat-resistant temperature of the photoelectric conversion section 50. Therefore, the fusion temperature of the metallic material is preferably lower than the heat-resistant temperature of the photoelectric conversion section. The heat-resistant temperature of the photoelectric conversion section is a temperature at which characteristics of a solar cell including the photoelectric conversion section or a solar cell module prepared using the solar cell are irreversibly reduced. For example, in the heterojunction solar cell, the single-crystalline silicon substrate that forms the photoelectric conversion section hardly undergoes a change in characteristics even when heated to a high temperature of 500° C. or higher, but the transparent electrode layer and the amorphous silicon-based thin-film may undergo thermal degradation or diffusion of dope impurities when heated to about 250° C., thus causing an irreversible reduction in the solar cell characteristics. Therefore, the fusion temperature of the metallic material in the first electroconductive layer material that is used for formation of a heterojunction solar cell is preferable 250° C. or lower, more preferably 200° C. or lower, further preferably 180° C. or lower.

When there is a large difference between the fusion temperature of the metallic material and the annealing temperature Ta, thermal-fluidization associated with fusion of the metallic material may excessively increase to cause a failure. Thus, it is preferred to appropriately adjust the annealing temperature according to the characteristics of the metallic material. Alternatively, it is preferred to select a metallic material suited to the annealing temperature.

In a particulate metallic material, fusion of metal particles may occur at a temperature lower than the melting point, i.e., about 200° C. or lower when the size (e.g., particle size) etc. is adjusted even though the metallic material is a material having a high melting point, such as silver, copper or gold. When a material, in which fusion of particulate metallic materials occurs as described above, is heated to a temperature equal to or higher than a fusion onset temperature, deformation occurs in the vicinity of the outer circumferential portions of metal particles to cause a change in surface shape of the first electroconductive layer material, so that an opening section can be formed in the insulating layer 9.

Metal particles contained in the electroconductive paste are primary particles dispersed in an insulating material or a solvent, but by heating during annealing treatment, adjacent particles are fused together to generate secondary particles. The generation amount (area ratio), the particle size and the like of secondary particles in the metal particle component can be known by cross-section observation of the first electroconductive layer after annealing treatment as described above. These indices are closely related to the degree of progress of fusion of metal particles in the first electroconductive layer material during annealing.

When the ratio of secondary particles and the coefficient of variation in particle size of secondary particles in the first electroconductive layer after annealing treatment fall within the above-mentioned ranges, respectively, the distribution of openings formed in the insulating layer is appropriately controlled. Accordingly, the second electroconductive layer is appropriately formed, so that a solar cell having high efficiency and high reliability is obtained. Thus, when an electroconductive paste containing metal particles is used as the first electroconductive layer material, there is an appropriate range for the progress state of fusion of the metallic material, and by controlling the progress state, a solar cell having high efficiency and high reliability is obtained.

Examples of the conditions for controlling the progress of fusion of metallic materials include a dimension and shape of the metallic material, a ratio of the metallic material and the insulating material, and a heating condition during annealing treatment. Since the motive power for fusion of metallic materials is a decrease in surface energy, the degree of fusion can be controlled by changing the specific surface area (ratio of the surface area and the volume) of the metallic material and the surface curvature radius of the metallic material (i.e., controlling the particle size and shape).

Since fusion of metallic materials is a phenomenon which is started when metallic materials come into contact with each other, occurrence of fusion can be controlled by adjusting the ratio of the metallic material and the insulating material to control the average distance between adjacent metallic materials. Since fusion is promoted as the temperature increases, the degree of fusion can also be controlled according to the heating condition during annealing treatment. For preparing a solar cell having high efficiency and excellent reliability, it is necessary to control the progress of fusion of the particulate metallic material so that it falls within an appropriate range. The particle size distribution of the particulate metallic material, which is strongly correlated to the progress of fusion, is an important factor for appropriately forming an opening section in the insulating layer.

For ensuring that the ratio of secondary particles in the metal particle component after annealing falls within the above-mentioned range, it is preferred that the particle sizes of the particulate metallic material contained in the electroconductive paste have a certain distribution. Generally, there is a correlation between the particle size and the temperature at which fusion progresses, and the temperature at which fusion occurs tends to decrease as the particle size becomes smaller. When the particle size distribution is small, fusion of metal particles easily occurs over a relatively narrow temperature range. When the particle size distribution is large, fusion gradually progresses from a metallic material having a small particle size, and therefore fusion progresses slowly, so that it becomes easy to control progress of fusion.

The particle size distribution can be evaluated according to the coefficient of variation CV, and the larger the coefficient of variation, the larger the particle size distribution. When an electroconductive paste containing metal particles having a large coefficient of variation in particle size is used, the coefficient of variation in particle size of the metal particle component contained in the first electroconductive layer tends to increase after the annealing treatment.

For example, when a first electroconductive layer material (electroconductive paste) containing metal particles having an average particle size of 0.1 to 1 μm and a coefficient of variation of 0.2 or more is used, and an annealing treatment is performed at 140 to 250° C., the area ratio and coefficient of variation of secondary particles in the metal particle component contained in the first electroconductive layer can be easily controlled to be 1 to 30% and 0.3 or more, respectively.

As in the case of the particle size in the first electroconductive layer, the particle size of metal particles in the second electroconductive layer material is determined by cross-section observation. When the particle size of metal particles in a material having fluidity, such as an electroconductive paste, is determined, cross-section observation may be performed after the material is applied (printed), and then heated at such a low temperature that fusion of metal particles does not progress (e.g., at a temperature lower than 140° C.), whereby the solvent is removed to solidify the first electroconductive layer material.

When a collecting electrode is formed using only an electroconductive paste as in JP A 2002-76398, JP A 2010-87131, and JP A 2013-196954, for example, a paste having a uniform particle size and a small coefficient of variation is preferably used for reducing the resistivity of the collecting electrode. When an electroconductive paste is used in an underlying layer (first electroconductive layer) for plating as in the present invention, a second electroconductive layer formed by plating principally contributes to reduction of the resistance of the collecting electrode. Thus, the first electroconductive layer is not required to have a lower resistivity as compared to a case where a collecting electrode is formed using only an electroconductive paste.

The particle size of the metallic material contained in the electroconductive paste is preferably 10 μm or less from the viewpoint of printability or the like. A screen mask with a fine mesh is often used for achieving fine line width (e.g., a line width of 50 μm or less) in a screen printing method, and therefore the particle size of the metallic material is apt to have a noticeable influence. The particle size is preferably as small as possible for achieving fine line width. When the amount of components having a small particle size is excessively large, it may be difficult to control progress of fusion of the metallic material.

Thus, in metal particles in the electroconductive paste, the area ratio of particles having a particle size of 100 nm to 10 μm is preferably 80% or more. For providing a solar cell having high efficiency and excellent reliability, the area ratio of particles having a particle size of 100 nm to 10 μm is more preferably 90% or more, most preferably 100%. When the particle size of metal particles is within the above-mentioned range, fine line width and reduction of contact resistance are easily achieved.

The fusion temperature of metal particles is preferably 250° C. or lower, more preferably 200° C. or lower, further preferably 180° C. or lower in formation of a heterojunction solar cell including a transparent electrode layer and an amorphous silicon-based thin-film. For forming an opening in the insulating layer by causing fusion of metal particles to sufficiently progress under the limitation of the heating temperature as described above, it is preferred that the electroconductive paste contains metal particles having such a small particle size that fusion easily progresses at a low temperature. Specifically, it is preferred that the electroconductive paste contains particles having a particle size of less than 300 nm. In metal particles in the electroconductive paste, the number of particles having a particle size of less than 300 nm is preferably 30% or more, and more preferably 40 to 90% of the total number of particles.

In the solar cell of the present invention, the second electroconductive layer of the collecting electrode formed by a plating method principally contributes to removing charge carriers to the outside (electrical conduction to a wiring member) as described above, so that the first electroconductive layer is not required to have a resistivity which is as low as that of the second electroconductive layer. Contact resistance between a surface of the photoelectric conversion section (transparent electrode layer in a heterojunction solar cell) and the first electroconductive layer may cause a carrier collection loss. For reducing contact resistance between the photoelectric conversion section and the first electroconductive layer, it is preferred to increase the number of contact points between the metal particle component in the first electroconductive layer and the photoelectric conversion section, or to use metal particles having low surface resistance. For increasing the number of contact points between the metal particle component and the photoelectric conversion section, it is preferred that the electroconductive paste contains particles having a particle size of less than 300 nm. As the particle having a particle size of less than 300 nm, a metal particle mainly composed of a material having low surface resistance is preferred for reducing the contact resistance by increasing the number of contact points between the metal particle component and the photoelectric conversion section. Silver particles are preferred because an oxide is hardly formed on the surface and surface resistance is low.

It is preferred that metal particles in the electroconductive paste have a small particle size for causing fusion to progress at a low annealing temperature and increasing the number of contact points with the photoelectric conversion section as described above. For controlling the progress of fusion and suppressing generation of an excessive amount of secondary particles, it is preferred that the electroconductive paste contains particles having a particle size of 1 μm or more. Particles having a particle size of 1 μm or more are apt to remain as primary particles even after annealing because they are hardly fused even when heated to about 250° C. Thus, when the electroconductive paste contains metal particles having a particle size of 1 μm or more, the ratio of secondary particles is easily controlled to be within the above-mentioned range.

Particles having a particle size of less than 300 nm contribute more to an increase in the number of contact points with the photoelectric conversion section than a primary particle having a particle size of 1 μm or more. Thus, the material of the metal particle having a particle size of 1 μm or more is not particularly limited as long as it is a metal having electroconductivity. For example, as a material less expensive than silver, metal particles mainly composed of a metal other than silver, such as aluminum, nickel or tin, and having a particle size of 1 μm or more are preferred.

Figure 8A:
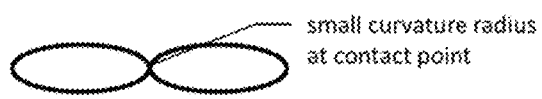
FIG. 8 is a conceptual view showing the shape of a metal particle component in which fusion occurs.
Figure 8A:
Figure 8B:
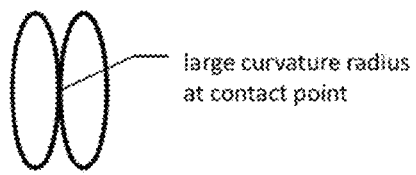
Figure 8B:
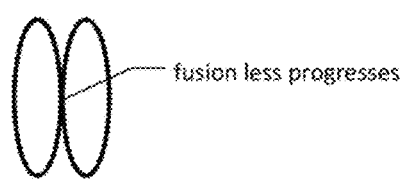

In this embodiment, it is preferred that a metallic material having an appropriate shape is selected for controlling fusion of particles. Since a difference between the pressure of a gas phase and the pressure of a liquid phase at the gas-liquid interface is inversely proportional to a curvature radius (Laplace's law), the temperature at which fusion occurs decreases as the curvature radius at a contact point between metallic materials becomes smaller as shown in FIGS. 8A and 8B. A spherical metallic material has the same curvature radius at any position on the surface, while a nonspherical metallic material varies in curvature radius depending on a position on the surface. Fusion starts at a location where metallic materials come into contact with each other, and therefore when spherical and nonspherical metallic materials have comparable particle sizes, the nonspherical metallic material tends to be fused at a higher temperature, so that fusion less easily progresses.

Since the spherical metallic material has a constant surface curvature radius, a spherical metallic material having a small particle size distribution is easily fused at a time when heated at a constant temperature. The nonspherical metallic material has a distribution in surface curvature radius, and therefore tends to have a distribution in fusion onset temperature even when the particle size distribution is small. The distribution of fusion onset temperature in a nonspherical metallic material relates to the shape of particles (distribution in surface curvature radius). When a nonspherical metallic material is used, fusion tends to be suppressed because the packing ratio of the metallic material in the first electroconductive layer material is lower, as compared to a case where only a spherical metallic material is used, and thus resin more easily enters between metallic materials.

From the viewpoint of forming an opening section in the insulating layer by means of thermal-fluidization associated with fusion of the metallic material, the shape of the metallic material may be spherical or nonspherical. As described above, it is preferred that the electroconductive paste contains nonspherical particles as primary particles due to the ease of controlling a rate of fusion. A particle in which the ratio of lengths of the major axis and the minor axis (major axis/minor axis), when viewed in a cross-section, is 2 or less is defined as a spherical particle. A particle in which the ratio of lengths of the major axis and the minor axis, when viewed in a cross-section, is more than 2 is defined as a nonspherical particle. More preferably, the metallic material in the electroconductive paste is mainly composed of nonspherical particles. The phrase "mainly composed of nonspherical metal particles" means that the area ratio of nonspherical metal particles to the total area of metal particles in cross-section observation is larger than 50%. The area ratio of nonspherical metal particles is more preferably 80% or more, and most preferably 100%.

As described above, the electroconductive paste contains particles having a particle size of less than 300 nm, and thus fusion easily progresses at low temperatures. Even when spherical and nonspherical particles have comparable particle sizes, nonspherical particles tend to be fused over a wider temperature range. When the electroconductive paste contains nonspherical metal particles having a particle size of less than 300 nm, fusion starts at a low temperature, and an excessive rate of fusion can be suppressed. Thus, it is preferred that the electroconductive paste is mainly composed of nonspherical metal particles having a particle size of less than 300 nm.

Figure 3A:
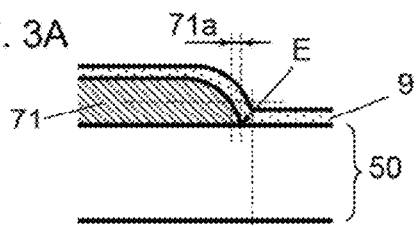
FIG. 3 is a conceptual view of a process for manufacturing a solar cell according to one embodiment.

As a result of studies conducted by the present inventors, it has been found that the shape of the first electroconductive layer material in the vicinity of the end portion may change depending on the type of a metallic material contained in the first electroconductive layer material and conditions for the annealing treatment. When fusion of metal particles by the annealing treatment excessively progresses, the first electroconductive layer material may be deformed. This is shown, for example in the comparison between FIG. 3A and FIG. 3B, where the endmost portion E of the first electroconductive layer material may shift to a position shown by E'. This leads to generation of a region, which is not provided with either the first electrconductive layer or the insulating layer, on the photoelectric conversion section 50.

Figure 3B:
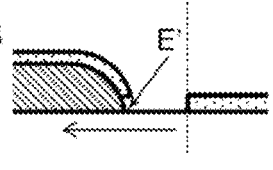

When fusion of metal particles progress, secondary particles tend to be aggregated so as to reduce the surface area. The aggregation is accompanied with a cohesive force so that particles situated at the endmost portion E of the first electroconductive layer material shift to the center portion E' side. With this movement of particles, a crack-like opening section parallel to the extending direction of the first electroconductive layer may be formed in the insulating layer in the vicinity of the endmost portion E of the first electroconductive material, leading to generation of a region which is not covered with either the first electroconductive layer or the insulating layer as shown in FIG. 3B.

Hereinafter, a region where the thickness is less than or equal to ½ of the average thickness of the first electroconductive layer at the outer circumferential portion (in the vicinity of both ends in the width direction) of the first electroconductive layer is defined as an end region 71a of the first electroconductive layer (see FIG. 3). In the end portion 71a of the first electroconductive layer, a region where the thickness of the first electroconductive layer is smaller than the irregularity height in the texture of the photoelectric conversion section is defined as a first electroconductive layer low-coverage region 71b, and an endmost portion situated at the boundary between a first electroconductive layer-formed region and a first electroconductive layer-non-formed region is defined as a first electroconductive layer end 71e (see FIG. 6).

In a region where neither the first electroconductive layer nor the insulating layer is provided, the surface of the photoelectric conversion section is not protected in the plating step during formation of the second electroconductive layer. Thus, the photoelectric conversion section is exposed to a plating solution, so that the second electroconductive layer material is deposited, and the photoelectric conversion section is damaged by the plating solution. For reliably protecting the first electroconductive layer in the vicinity of the endmost portion during the plating step, it is preferred that the insulating layer is continuously formed at the endmost portion of the first electroconductive layer after annealing treatment. Specifically, the ratio of a region provided with an opening section in the insulating layer on the endmost portion of the first electroconductive layer is preferably 15% or less, and more preferably 5% or less. The formation ratio of the opening section in the insulating layer on the endmost portion is determined by observing a plurality of (10 or more) cross-sections along the extending direction of the first electroconductive layer, and checking whether an opening section is formed in the insulating layer on the endmost portion of the first electroconductive layer on each cross-section for 20 or more endmost portions.

For reliably protecting the endmost portion of the first electroconductive layer, it is preferred that fusion of metal particles does not excessively progress. The ratio of secondary particles in the metal particle component in the first electroconductive layer after annealing treatment is preferably 1% or more, more preferably 2% or more, and even more preferably 4% or more, for reliably forming an opening section in the insulating layer by fusion of the particulate metallic material as described above. For preventing defects such as breakage of the first electroconductive layer due to excessive thermal-fluidization and a failure resulting from undesired formation of an opening section in the insulating layer (e.g., formation of an opening section in the end region of the first electroconductive layer as shown in FIG. 3B), it is preferred that fusion does not excessively progress, and the ratio of secondary particles in the metal particle component in the first electroconductive layer after annealing treatment is preferably 30% or less, more preferably 25% or less, and even more preferably 20% or less.

The first electroconductive layer material after the annealing treatment, has a small ratio of secondary particles because fusion of metal particles does not progress. Thus, for ensuring that the content of secondary particles in the metallic material in the first electroconductive layer after annealing is in the above-mentioned range, the amount of increase in the ratio of secondary particles by the annealing treatment is preferably 1% or more, more preferably 2% or more, and even more preferably 4% or more.

As described above, when metal particles are fused to generate secondary particles, the surface shape changes, leading to formation of an opening in the insulating layer. Thus, an opening section is easily formed in the insulating layer in the vicinity of a secondary particle generation portion on the first electroconductive layer. For attaining a state in which the insulating layer is continuously formed at the endmost portion of the first electroconductive layer, it is preferred that an opening section is not formed in the insulating layer in the vicinity of the endmost portion even when the particulate metallic material in the end region is fused to form secondary particles by annealing of the first electroconductive layer material.

Figure 5A:
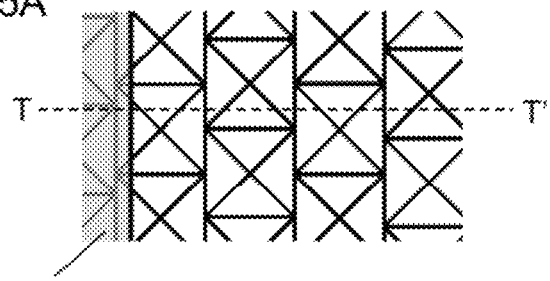
FIG. 5 is a conceptual view for explaining the shape of an end portion of a first electroconductive layer immediately after a paste is printed.
Figure 5B:
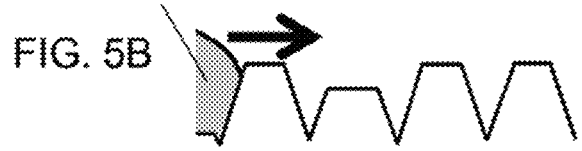
Figure 6A:
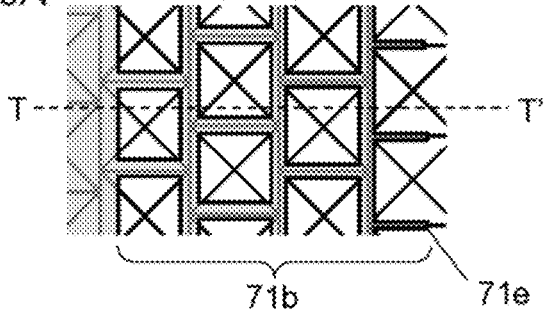
FIG. 6 is a conceptual view for explaining the shape of the end portion of the first electroconductive layer after the paste oozes.
Figure 6B:
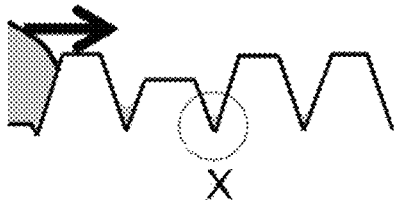

FIG. 5A shows a plan view of an external appearance immediately after printing an electroconductive paste when an electroconductive paste 711 is formed on a photoelectric conversion section having a textured structure (irregularity structure) on a surface thereof. FIG. 5B shows a sectional view taken along line T-T' of FIG. 5A. FIG. 6A shows a plan view of an external appearance after the electroconductive paste oozes. FIG. 6B shows a sectional view taken along line T-T' of FIG. 6A. The electroconductive paste 711 easily flows so as to ooze into the first electroconductive layer-non-formed region by passing through valleys (recessed portion) in the irregularity structure.

Figures 7A, 7B:
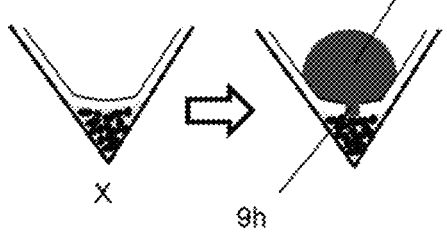
FIG. 7 is a conceptual view for explaining the shape of the end portion of the first electroconductive layer.

FIG. 7 schematically shows situations before and after the annealing treatment of the first electroconductive layer material and the formation of the second electroconductive layer in a recessed portion X in the irregularity structure, shown in FIG. 6B. When an insulating layer is formed on the first electroconductive layer-non-formed region and the first electroconductive layer on the photoelectric conversion section (FIG. 7A), and an opening section $9h$ is formed in the insulating layer on the first electroconductive layer by the annealing treatment, a second electroconductive layer 72 is formed with the opening section $9h$ as an origination point as shown in FIG. 7B.

A region provided with the second electroconductive layer also includes a region where a surface of the photoelectric conversion section is not covered with the first electroconductive layer. In a region which is not covered with the first electroconductive layer, the second electroconductive layer hardly contributes to a reduction of ohmic loss while blocking light-incident to the photoelectric conversion section. Thus, the shading loss tends to increase with an increase in a shading region, leading to a deterioration of solar cell characteristics. For reducing the shading loss, the density of the opening section in the insulating layer on the end region of the first electroconductive layer is preferably lower than the density of the opening section at the center portion of the first electroconductive layer. More specifically, the area of a region provided with the second electroconductive layer in the first electroconductive layer low-coverage region is preferably 50% or less, and more preferably 30% or less.

In the first electroconductive layer low-coverage region, it is more preferred that an opening section is not formed in the insulating layer and the second electroconductive layer is not formed on the first electroconductive layer end. The "center portion of the first electroconductive layer" means a region other than end regions of the first electroconductive layer. In the center portion, the thickness of the first electroconductive layer is larger than ½ of the average thickness.

In the end region 71a of the first electroconductive layer, the thickness of the first electroconductive layer is less than the thickness at the center portion. As shown in FIGS. 6A and 6B, the end region is formed by oozing of the electroconductive paste. To be more specific, as shown in FIG. 5, the electroconductive paste exists only in the printing region immediately after printing. The electroconductive paste is spread out due to fluidity of the paste to form the end region 71a in which the electroconductive paste oozes as shown in FIG. 6. In the electroconductive paste, a resin (insulating material) and a solvent more easily ooze than metal particles. Thus, the end region of the first electroconductive layer tends to have a smaller amount of the metallic material as compared to the center portion. Even if in the end region, the metallic material is fused to form secondary particles, thermal-fluidization sufficient to form an opening section in the insulating layer does not occur when the abundance density of metal particles is small. Thus, in the end region of the first electroconductive layer, an opening is less easily formed in the insulating layer than at the center portion of the first electroconductive layer.

From the above-mentioned point of view, it is necessary to control progress of fusion of the metallic material so that an opening section is not formed in the insulating layer even when the particulate metallic material contained in the electroconductive paste in the first electroconductive layer low-coverage region is fused to form secondary particles. For suppressing formation of an opening section in the end region of the first electroconductive layer, the ratio of secondary particles in the metal particle component in the first electroconductive layer after annealing treatment is preferably 30% or less, and more preferably 20% or less.

Although the present invention has been described above mainly for a case where the collecting electrode 70 is provided on the light-incident-side of a heterojunction solar cell, a similar collecting electrode may also be formed on the back-side of a heterojunction solar cell. For example, a light-incident-side first electroconductive layer, a light-incident-side insulating layer and a light-incident-side second electroconductive layer can be formed on the light-incident-side of a crystalline silicon substrate. A back-side first electroconductive layer, a back-side insulating layer and a back-side second electroconductive layer can be formed on the back-side of the crystalline silicon substrate. The insulating layers on the light-incident-side and on the back-side may be formed simultaneously.

An annealing treatment is performed for forming an opening section in the insulating layer on the back-side. The collecting electrode on the light-incident-side is also heated in the annealing treatment, and therefore the collecting electrode may have reduced resistance due to an annealing effect. On the other hand, problems arise such as oxidation of the second electroconductive layer on the light-incident-side by heating, and thermal diffusion of the metallic material. Thus, when a collecting electrode similar to that on the light-incident-side is also formed on the back-side, it is preferred that the annealing treatments of the first electroconductive layers on the light-incident-side and on the back-side are carried out simultaneously. For improving productivity by reducing the number of times that plating is performed, it is preferred that the second electroconductive layer on the light-incident-side and the second electroconductive layer on the back-side are formed simultaneously.

Specifically, a light-incident-side first electroconductive layer, a back-side first electroconductive layer, a light-incident-side insulating layer and a back-side insulating layer are formed in this order. An annealing treatment is then performed to form an opening section in the light-incident-side insulating layer and the back-side insulating layer. In this case, the number of annealing treatments, as described above, can be reduced to improve productivity. At the same time, oxidation, diffusion and so on of the light-incident-side second electroconductive layer can be suppressed.

Thereafter, the solar cell is introduced into a plating apparatus, and a plating step is carried out with a current passed through the light-incident-side first electroconductive layer and the back-side first electroconductive layer, whereby a second electroconductive layer is formed on the light-incident-side and on the back-side simultaneously.

Since a large amount of current is generated in a heterojunction solar cell, an increase in contact resistance between a transparent electrode layer and a collecting electrode and between a collecting electrode and a tab line, generally tends to result in a noticeable power generation loss. Particularly, when only an electroconductive paste is used as a collecting electrode as in JP A 2002-76398, JP A 2010-87131, and JP A 2013-196954, a power generation loss occurs even though a material for electroconductive particles contained in the electroconductive paste is optimized. On the other hand, in a collecting electrode including a first electroconductive layer formed from an electroconductive paste and a second electroconductive layer formed by a plating method as in the present invention, line resistance and connectivity with a tab line is not so important for the first electroconductive layer. Accordingly, more efforts can be focused on reduction of contact resistance with a transparent electrode layer, and therefore a power generation loss resulting from contact resistance can be reduced.

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a p-i-n junction or a p-n junction of an amorphous silicon-based thin-film or a crystalline silicon-based thin-film, compound semiconductor solar cells such as CIS and CIGS; and organic thin-film solar cells, such as dye-sensitized solar cells and organic thin-film (electroconductive polymer).

The crystalline silicon solar cell includes a configuration in which a diffusion layer of opposite conductivity-type (e.g., n-type) is provided on one principal surface of a crystalline silicon substrate of first conductivity-type (e.g., p-type), and the collecting electrode is provided on the diffusion layer. This crystalline silicon solar cell generally includes a conductive layer such as a $p^+$ layer on a side opposite to the layer of first conductivity-type. Thus, when the photoelectric conversion section does not include an amorphous silicon layer or a transparent electrode layer, the fusion temperature of the metallic material and the annealing temperature Ta, may be higher than 250° C.

Examples of the silicon-based thin-film solar cell include an amorphous silicon-based thin-film solar cell having an amorphous intrinsic (i-type) silicon thin-film between a p-type thin-film and an n-type thin-film, and a crystalline silicon-based solar cell having a crystalline intrinsic silicon thin-film between a p-type thin-film and an n-type thin-film. A tandem-type thin-film solar cell, in which a plurality of p-i-n junctions are stacked, is also suitable. In this silicon-based thin-film solar cell, the fusion temperature of the metallic material and the annealing temperature Ta, are preferably 250° C. or lower, more preferably 200° C. or lower, and even more preferably 180° C. or lower, in consideration of the heat resistance of the transparent electrode layer and the amorphous silicon-based thin-film.

The solar cell of the present invention is preferably modularized when put into practical use. Modularization of the solar cell is performed by an appropriate method. For example, by connecting a bus bar via an interconnector such as a tab to a collecting electrode, a plurality of solar cells are connected in series or in parallel, and sealed by a sealing material and a glass plate to thereby perform modularization.

EXAMPLES

The present invention will be more specifically described below by showing examples relating to the heterojunction solar cell, but the present invention is not limited to the Examples below.

Example 1

An n-type single-crystalline silicon wafer having a light-incident surface direction identical to the (100) surface and having a thickness of 200 m was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes to etch the surface of the wafer. Thereafter, the wafer was rinsed twice with ultrapure water. The surface of the wafer was observed using an atomic force microscope (AFM manufactured by Pacific Nanotechnology, Inc.) to confirm progress of etching on the substrate surface and formation of pyramid-shaped textures exposed at the (111) surface.

The wafer after etching was introduced into a CVD apparatus, and at the light-incident-side thereof, i-type amorphous silicon was formed with a thickness of 5 nm. Conditions for forming i-type amorphous silicon included a substrate temperature of 150° C., a pressure of 120 Pa, a $SiH_4/H_2$ flow ratio of 3/10 and a power density of 0.011 $W/cm^2$. The thickness of the thin-film in this example is a value calculated from a formation rate determined by measuring the thickness of a thin-film formed on a glass substrate under the same conditions using a spectroscopic ellipeometry (trade name: M2000, manufactured by J. A. Woollam Co. Inc.).

On the i-type amorphous silicon layer, a p-type amorphous silicon layer was formed with a thickness of 7 nm. Conditions for forming the p-type amorphous silicon layer included a substrate temperature of 150° C. a pressure of 60 Pa, a $SiH_4/B_2H_6$ flow ratio of 1/3 and a power density of 0.01 $W/cm^2$. The $B_2H_6$ gas flow rate mentioned above is a flow rate of a diluting gas wherein $B_2H_6$ concentration was diluted to 5000 ppm using $H_2$ gas.

Thereafter, on the back-side of the wafer, an i-type amorphous silicon layer was formed with a thickness of 6 nm. Conditions for forming the i-type amorphous silicon layer were the same as those for the aforementioned i-type amorphous silicon layer on the light-incident-side. On the i-type amorphous silicon layer, an n-type amorphous silicon layer was formed with a thickness of 4 nm. Conditions for forming the n-type amorphous silicon layer included a substrate temperature of 160° C., a pressure of 60 Pa, a $SiH_4/PH_3$ flow ratio of 1/2 and a power density of 0.01 $W/cm^2$. The $PH_3$ gas flow rate mentioned above is a flow rate of a diluting gas wherein $PH_3$ concentration was diluted to 5000 ppm using $H_2$ gas.

On each of the p-type amorphous silicon layer and the n-type amorphous silicon layer, indium tin oxide (ITO) was formed with a thickness of 100 nm as a transparent electrode layer. The transparent electrode layer was formed by applying a power density of 0.5 $W/cm^2$ in an argon atmosphere at a substrate temperature of room temperature and a pressure of 0.2 Pa using indium oxide as a target. On the back-side transparent electrode layer, silver was formed with a thickness of 500 nm as a back-side metal electrode by a sputtering method. A collecting electrode having a first electroconductive layer and a second electroconductive layer was formed on the light-incident-side transparent electrode layer in the following manner.

For formation of the first electroconductive layer, an electroconductive paste containing spherical silver particles (average particle size: 0.2 µm) as a particulate metallic material, and an epoxy-based resin as an insulating material was used. The electroconductive paste was screen-printed using a #500 mesh-screen mask having an opening section width (L=40 µm) corresponding to a collecting electrode pattern, and then dried at 130° C.

The wafer was introduced into a CVD apparatus, and a silicon oxide layer with a thickness of 80 nm was formed on the entire light-incident surface by a plasma-enhanced CVD method. Conditions for forming the silicon oxide layer included a substrate temperature of 135° C., a pressure of 133 Pa, a $SiH_4/CO_2$ flow ratio of 1/20 and a power density of 0.05 $W/cm^2$ (frequency 13.56 MHz). Thereafter, the wafer after formation of the silicon oxide layer was introduced into a circulating hot air oven, and subjected to an annealing treatment at 170° C. for 1 hour in an air atmosphere.

The substrate subjected to the annealing treatment was introduced into a plating tank filled with a plating solution. For a plating solution, one obtained by adding additives (product numbers: ESY-2B, ESY-H and ESY-1A, manufactured by C. Uyemura & CO., LTD.) to a solution prepared so that the concentrations of copper sulfate pentahydrate, sulfuric acid and sodium chloride were 120 g/l, 150 g/l and 70 mg/l, respectively, was used. Plating was carried out under conditions including a temperature of 40° C. and a current of 3 $A/dm^2$, so that on the silicon oxide layer on the first electroconductive layer, copper was uniformly deposited at a thickness of about 10 µm as a second electroconductive layer. Little copper was deposited onto a region where no first electroconductive layer was formed.

Thereafter, the silicon wafer on the cell outer periphery was removed in a width of 0.5 mm by a laser processing apparatus.

A wiring member was arranged on each of a light-incident-side electrode and a back-side electrode with an electroconductive adhesive interposed therebetween, and a pressure of 2 MPa was applied at a temperature of 180° C. for 15 seconds to connect the wiring member onto the electrode, thereby preparing a solar cell string. As the electroconductive adhesive, a film-shaped resin containing 10% by mass of Ni with an average particle size of about 10 µmφ in an epoxy resin composition was selected.

A solar cell module was prepared using a solar cell string with a wiring member connected in the manner described above. An iron-free glass plate ("white" glass plate) was provided as a light-incident-side protective material, EVA was provided as a light-incident-side encapsulant and a back-side encapsulant, a 30 µm-thick single-layer PET (polyethylene terephthalate) film was provided as a back-side protective material, and the iron-free glass plate, EVA, a solar cell string, EVA and PET were stacked in this order, and were integrated by pressing under heating condition. Thereafter, thermal press bonding was carried out at atmospheric pressure for 5 minutes, and subsequently held at 150° C. for 60 minutes to crosslink the EVA resin.

A solar cell module including a heterojunction solar cell was prepared through the steps described above.

Example 2

Except that an electroconductive paste containing non-spherical silver particles (average particle size: 0.24 µm) was used as a metal particle component, and a substrate was introduced into an oven set at 200° C. for 1 hour, and subjected to an annealing treatment, the same procedure as in Example 1 was carried out to prepare a solar cell and modularization.

Example 3

Except that a substrate was introduced into an oven set at 180° C. for 1 hour, and subjected to an annealing treatment, the same procedure as in Example 2 was carried out to prepare a solar cell and modularization.

Example 4

Except that an electroconductive paste containing non-spherical silver particles (average particle size: 0.30 µm) was used as a metal particle component, the same procedure as in Example 3 was carried out to prepare a solar cell and perform modularization. The particulate metallic material contained in the electroconductive paste used in Example 4 had a shape closer to a spherical shape as compared to Examples 2 and 3. In Table 1, the shape of particles in the electroconductive pastes used in Examples 2 and 3 is described as "nonspherical shape a", and the shape of particles in the electroconductive paste used in Example 4 is described as "nonspherical shape b".

Comparative Example 1

Except that a substrate was introduced into an oven set at 200° C. for 1 hour, and subjected to an annealing treatment, the same procedure as in Example 1 was carried out to prepare a solar cell and modularization.

Comparative Example 2

Except that an electroconductive paste containing spherical silver particles (average particle size: 0.10 µm) was used as a metal particle component, the same procedure as in Example 1 was carried out to prepare a solar cell and modularization.

Comparative Example 3

Except that the silicon oxide layer and the second electroconductive layer were not formed, and that the collecting electrode included only a first electroconductive layer formed of an electroconductive paste, the same procedure as in Example 1 was carried out to prepare a solar cell and perform modularization.

The power generation characteristics of the solar cell modules prepared in the Examples and Comparative Examples were evaluated. After evaluation of the characteristics, the module was disassembled, and a cross-section structure of the collecting electrode was observed to determine the coefficient of variation in particle size of the metallic material component in the first electroconductive layer, the area ratio of secondary particles, and the average particle size. The cross-section structure was prepared by embedding a sample in resin, and polishing the sample. For Examples 1 to 3 and Comparative Examples 1 and 10, cross-sections (total 20 endmost portions) were observed along the extending direction of the first electroconductive layer. On each cross-section, whether an opening section was formed in the insulating layer on the first electroconductive layer was checked to determine the formation ratio of the opening section formed in the insulating layer on the endmost portion.

Using a #500 mesh-screen mask, a printed layer of the electroconductive paste used in each of examples and comparative examples was formed, and dried at 130° C., and cross-section observation was then performed to determine the particle size of metal particles in the paste-printed layer (first electroconductive layer material). Secondary particles were not observed in any of the paste-printed layers. The average particle size of the electroconductive paste is an arithmetic average of particle sizes as determined by cross-section observation of the printed layer.

The particle size of the metallic material in the paste used for formation of the first electroconductive layer (particle size in cross-section observation of the paste-printed layer), the particle size of the metallic material component in the first electroconductive layer in the solar cell, the power generation characteristics, and the formation ratio of the opening section on the endmost portion of the first electroconductive layer are shown in Table 1. The power generation characteristics of the solar cell are each expressed as a relative value where the value in Comparative Example 3 is 1. There was no significant difference in open circuit voltage Voc among Examples and Comparative Examples. Therefore, only the values of the fill factor (FF) and the current density (Isc) are shown in Table 1.

TABLE 1

| | | | Electroconductive paste metallic material (Cross-section observation of printed layer) | | | | | | |
|---|---|---|---|---|---|---|---|---|---|
| | | Average particle size (µm) | Particle size ratio (% by number) | | | Particle size ratio (area %) | | | |
| | Particle shape | | Less than 0.3 µm | 0.3~1 µm | 1 µm or more | Less than 0.3 µm | 0.3~1 µm | 1 µm or more | CV |
| Example 1 | Spherical shape | 0.20 | 100 | 0 | 0 | 100 | 0 | 0 | 0.25 |
| Example 2 | Nonspherical shape a | 0.24 | 65 | 30 | 5 | 10 | 35 | 55 | 0.40 |
| Example 3 | Nonspherical shape a | 0.24 | 65 | 30 | 5 | 10 | 35 | 55 | 0.40 |
| Example 4 | Nonspherical shape b | 0.30 | 70 | 29 | 1 | 25 | 65 | 10 | 0.40 |
| Comparative Example 1 | Spherical shape | 0.20 | 100 | 0 | 0 | 100 | 0 | 0 | 0.25 |
| Comparative Example 2 | Spherical shape | 0.10 | 100 | 0 | 0 | 100 | 0 | 0 | 0.25 |
| Comparative Example 3 | Spherical shape | 0.20 | 100 | 0 | 0 | 100 | 0 | 0 | 0.25 |

| | First electroconductive layer metallic material | | | | Power generation characteristics | | Opening formation ratio at endmost portion |
|---|---|---|---|---|---|---|---|
| | Heating temperature (° C.) | Average particle size (µm) | Ratio of secondary particles (area %) | Primary particles of 1 µm or more (% by number) | CV | FF | Isc | (%) |
| Example 1 | 170 | 0.25 | 15 | 0 | 0.35 | 1.13 | 1.00 | 10 |
| Example 2 | 200 | 0.25 | 5 | 55 | 0.60 | 1.15 | 1.00 | 10 |
| Example 3 | 180 | 0.25 | 3 | 55 | 0.90 | 1.16 | 1.00 | 5 |
| Example 4 | 180 | 0.35 | 15 | 10 | 0.60 | 1.12 | 1.00 | N.D. |

TABLE 1-continued

|  |  |  |  |  |  |  |  |  |
|---|---|---|---|---|---|---|---|---|
| Comparative Example 1 | 200 | 0.38 | 50 | 0 | 0.95 | 0.80 | 0.98 | 30 |
| Comparative Example 2 | 170 | 0.17 | 40 | 0 | 1.00 | 0.72 | 0.98 | N.D. |
| Comparative Example 3 | 170 | 0.25 | 15 | 0 | 0.35 | 1 | 1 | — |

In Comparative Example 1, a solar cell was prepared using the same electroconductive paste as in Example 1, but Comparative Example 1 in which an annealing treatment was performed at a higher temperature showed a higher ratio of secondary particles, and larger dispersion of particle sizes. This may be because as a result of performing an annealing treatment at a high temperature, fusion of the metal particle component progressed to a higher degree.

In Comparative Example 2, an annealing treatment was performed under the same conditions as in Example 1, but Comparative Example 2 in which a paste containing metal particles having a small particle size showed a higher ratio of secondary particles, and larger dispersion of particle sizes. In comparison between Comparative Examples 1 and 2, there was a difference in particle size of the metallic material contained in the electroconductive pastes, but there was no difference in ratio of secondary particles after annealing. These results show that in Comparative Example 2 in which metal particles in the paste have a small particle size, fusion more easily progresses at a low temperature.

In Example 1, the formation ratio of the opening section on the endmost portion of the collecting electrode was 10%, whereas the formation ratio of the opening section was 30% in Comparative Examples. At the end portion of the first electroconductive layer with a small thickness (low-coverage region), the second electroconductive layer was formed on the first electroconductive layer through the opening section therebetween. The transparent electrode layer below the first electroconductive layer in each of Comparative Examples 1 and 2 was observed, and confirmed an existence of region where the transparent electrode layer below the first electroconductive layer was missing. A region where the collecting electrode was delaminated in part was also observed. In Examples 1 to 4, a region which was not provided with the second electroconductive layer existed on the first electroconductive layer in the vicinity of the endmost portion. In Comparative Examples 1 and 2, in contrast, the second electroconductive layer was formed substantially the entire region of the first electroconductive layer in the vicinity of the endmost portion, and the second electroconductive layer was also formed outside the endmost portion of the first electroconductive layer (on the first electroconductive layer-non-formed region).

The above results show that in Comparative Examples 1 and 2, fusion of metal particles excessively progressed during annealing treatment, and a large number of opening sections were formed in the first electroconductive layer low-coverage region as well. Considerable reduction in FF of the solar cell is assumed to be due to the increase of contact resistance between the transparent electrode layer and the first electroconductive layer. During formation of the second electroconductive layer, the plating solution came into contact with the transparent electrode layer through the opening section formed in the insulating layer in the vicinity of the endmost portion of the first electroconductive layer, so that the transparent electrode layer was etched to increase contact resistance thereof. The Isc in Comparative Examples 1 and 2 is lower by about 2% than the Isc in Examples 1 to 4. This is ascribable to an optical loss resulting from shading by the second electroconductive layer formed outside the endmost portion of the first electroconductive layer.

In comparison between Examples 1 and 3, there was substantially no difference in average particle size of the particulate metallic material contained in the electroconductive paste. Although the heating temperature during annealing treatment was lower in Example 1, the ratio of secondary particles after annealing treatment was higher in Example 1 than in Example 3. This indicates that in Example 1, metal particles are spherical, and the ratio of particles having a particle size of less than 0.3 μm is high, so that fusion easily occurs at a low temperature. As solar cell performance, a higher FF was obtained in Example 3 in which the ratio of secondary particles was low. The state of the transparent electrode layer below the first electroconductive layer was examined, and the result showed that in Example 3, the transparent electrode layer was not etched, whereas the transparent electrode layer was slightly etched in Example 1. It is considered that this difference in state of the transparent electrode layer is reflected to the FF change.

In each of Examples 2 and 3, a solar cell was prepared using an electroconductive paste including metal particle component having a nonspherical shape. Since the annealing treatment temperature and the ratio of secondary particles are higher in Example 2 than in Example 3, it is apparent that fusion of metal particles progresses to a higher degree in Example 2. The transparent electrode layer below the first electroconductive layer was observed, and the result showed that there was no significant difference in state of the transparent electrode layer between the examples, and a high FF was obtained as solar cell characteristics in both the examples.

In comparison between Examples 3 and 4, there was almost no difference in coefficient of variation of the metal particle component contained in the first electroconductive layer, and annealing treatment conditions, but there was a difference in ratio of secondary particles after annealing. It is apparent that in Example 4 in which the ratio of particles having a particle size of less than 0.3 μm in the electroconductive paste is high, the ratio of secondary particles after annealing is higher, and fusion of metal particles progresses to a higher degree. In comparison between Examples 3 and 4, there was no significant difference in state of the transparent electrode layer below the first electroconductive layer.

The above results show that by adjusting the shape and particle size of metal particles contained in the electroconductive paste, and annealing conditions, the secondary particle ratio and the coefficient of variation in particle size of the metallic material component contained in the first electroconductive layer after annealing can be adjusted. These values are closely related to formation of the opening section in the insulating layer due to progress of fusion of metal particles during annealing. When annealing is performed in such a manner that these values each fall within an appropriate range, the surface of the photoelectric conversion section can be appropriately protected from the plating solution during formation of a plating layer on the first electroconductive layer. Deposition of the plating layer on the first electroconductive layer-non-formed region (outside the endmost portion of the first electroconductive layer) can be suppressed. Thus, according to the present invention, a high-power solar cell can be provided by forming a collecting electrode by a plating method without patterning an insulating layer using a resist.

The invention claimed is:

1. A solar cell, comprising:
a photoelectric conversion section; and
a collecting electrode on a first principal surface of the photoelectric conversion section, wherein the collecting electrode comprises:
  a first electroconductive layer located on the first principal surface of the photoelectric conversion section and
  a second electroconductive layer located on the first electro conductive layer,
an insulating layer located on the first principal surface of the photoelectric conversion section, the insulating layer covering a part of the first electroconductive layer and substantially covering an entirety of a first electroconductive layer-non-formed region, which is not provided with the first electroconductive layer, and which has an opening section on the first electroconductive layer,
  wherein the second electroconductive layer is a plating layer that is in contact with the first electroconductive layer through the opening section of the insulating layer,
  wherein the first electroconductive layer contains a metal particle component and an insulating material, and
on a cross-section of the first electroconductive layer, the metal particle component comprises:
  a plurality of primary particles, where each primary particle is fused with other metal particles occupies less than 15% of an outer circumferential length of the primary particle; and
  secondary particles, each comprising:
    (i) a metal particle in which a region where the metal particle is fused with another metal particle occupies 15% or more of the outer circumferential length of the metal particle, and
    (ii) one or more metal particles fused with the metal particle,
  wherein the metal particle component satisfies an area ratio of the secondary particles to a total of the primary particles and the secondary particles, being 1% or more and 30% or less, and
  the metal particle component has a coefficient of variation in particle size of 0.3 or more.

2. The solar cell according to claim 1, wherein an average particle size of the metal particles in the metal particle component is 1 μm or less.

3. The solar cell according to claim 1, wherein the insulating layer has the opening section formed area ratio of 15% or less on an endmost portion of the first electroconductive layer.

4. The solar cell according to claim 1, wherein
the photoelectric conversion section has an irregularity structure on the first principal surface, and
a density of the opening section in the insulating layer on an end region of the first electroconductive layer is lower than a density of the opening section in the insulating layer on a center portion of the first electroconductive layer,
wherein the first electroconductive layer has a thickness equal to or less than ½ of an average thickness of the first electroconductive layer in the end region, and the first electroconductive layer has a thickness larger than ½ of the average thickness of the first electroconductive layer in the center portion.

5. The solar cell according to claim 1, wherein a ratio of the secondary particles in the metal particle component is 2% or more and 20% or less.

6. The solar cell according to claim 1, wherein the primary particles are mainly composed of nonspherical particles.

7. The solar cell according to claim 1, wherein the primary particles comprise a metal particle having a particle size of 1 μm or more.

8. The solar cell according to claim 7, wherein the metal particle having a particle size of 1 μm or more is mainly composed of a metal other than silver.

9. The solar cell according to claim 1, wherein the photoelectric conversion section on the first principal surface comprises a transparent electrode layer, and the transparent electrode layer is located just below the first electroconductive layer.

10. The solar cell according to claim 1 wherein the coefficient of variation in particle size is 0.5 or more.

11. The solar cell according to claim 1 wherein the coefficient of variation in particle size is 0.8 or more.

12. The solar cell according to claim 1 wherein the average particle size of the metal particle component contained in the first electroconductive layer is 0.5 μm or less.

13. The solar cell according to claim 1 wherein the average particle size of the metal particle component contained in the first electroconductive layer is 0.4 μm or less.

14. A method for manufacturing a solar cell, comprising, in order:
forming a first electroconductive layer by printing an electroconductive paste in a pattern shape on the first principal surface of the photoelectric conversion section, the electroconductive paste containing metal particles and an insulating material;
forming the insulating layer on the first principal surface of the photoelectric conversion section;
an annealing step of heating the electroconductive paste to form the opening section in the insulating layer,
forming a second electroconductive layer on the first electroconductive layer through the opening section of the insulating layer by a plating method,
and wherein a metal particle component is included in a cross-section of the first electroconductive layer after the annealing step, wherein
the metal particle component comprises:
  a plurality of primary particles where each primary particle is fused with other metal particles occupies less than 15% of an outer circumferential length of the primary particle; and
  secondary particles each comprising:
    (i) a metal particle in which a region where the metal particle is fused with another metal particles occupies 15% or more of the outer circumferential length of the metal particle, and
    (ii) one or more metal particles fused with the metal particle,
  wherein the metal particle component satisfies an area ratio of the secondary particles to a total of the primary particles and the secondary particles being 1% or more and 30% or less, and the metal particle component has a coefficient of variation in particle size of 0.3 or more;

wherein said method for manufacturing a solar cell forms a solar cell comprising:

a collecting electrode including the first electroconductive layer located on a first principal surface of a photoelectric conversion section, the second electroconductive layer located on the first electroconductive layer; and the insulating layer having the opening section between the first electroconductive layer and the second electroconductive layer.

15. The method for manufacturing a solar cell according to claim 14, wherein a metallic material in the electroconductive paste comprises a metal particle having a particle size of less than 300 nm.

16. The method for manufacturing a solar cell according to claim 15, wherein the metal particle having a particle size of less than 300 nm is mainly composed of silver.

17. The method for manufacturing a solar cell according to claim 16, wherein the metallic material in the electroconductive paste further comprises a particle that is mainly composed of a metal other than silver and has a particle size of 1 μm or more.

18. The method for manufacturing a solar cell according to claim 14, wherein a heating temperature in the annealing step is 250° C. or lower.

19. A solar cell, comprising:

a photoelectric conversion section;

a collecting electrode on a surface of the photoelectric conversion section, and an insulating layer located on a surface of the photoelectric conversion section, wherein the collecting electrode comprises:

a first electroconductive layer located on the surface of the photoelectric conversion section and a second electroconductive layer located on the first electroconductive layer, wherein the insulating layer covers a part of the first electroconductive layer and substantially covers an entirety of a first electroconductive layer-non-formed region, which is not provided with the first electroconductive layer, and which has an opening section on the first electroconductive layer, wherein the second electroconductive layer is a plating layer that is in contact with the first electroconductive layer through the opening section of the insulating layer, wherein the first electroconductive layer contains a metal particle component and an insulating material, and on a cross-section of the first electroconductive layer, the metal particle component comprises:

a plurality of metal particles fused to other metal particles, where a fused area is greater than or equal to 15% of a circumference of the plurality of metal particles, are called secondary particles;

wherein all other metal particles are called primary particles;

wherein the area ratio of the primary particles to a combination of the secondary particles plus primary particles is ≥1% and ≤30%, wherein the metal particle component has a coefficient of variation in particle size of 0.3 or more.

\* \* \* \* \*